United States Patent
Kubo et al.

[11] Patent Number: 5,541,504
[45] Date of Patent: Jul. 30, 1996

[54] SEQUENTIAL CONNECTING APPARATUS FOR AUTOMATIC TESTING

[75] Inventors: Kozo Kubo, Yokohama; Masaru Nishiwaki, Ichikawa; Shinichi Nonome, Yokohama; Hiromichi Kubota, Tokyo, all of Japan

[73] Assignee: All Nippon Airways Co., Ltd., Tokyo, Japan

[21] Appl. No.: 431,724

[22] Filed: May 1, 1995

Related U.S. Application Data

[63] Continuation of Ser. No. 968,331, Oct. 29, 1992, abandoned.

[30] Foreign Application Priority Data

Apr. 6, 1992 [JP] Japan ................................ 4-083928

[51] Int. Cl.⁶ .......................... G06F 15/20; G01M 14/00
[52] U.S. Cl. .............................. 324/158.1; 364/424.04; 324/73.1; 371/20.1
[58] Field of Search ...................... 324/758–763, 324/73.1, 73 AS; 89/1.816

[56] References Cited

U.S. PATENT DOCUMENTS

| 4,218,745 | 8/1980 | Perkins ..................................... 364/489 |
| 4,429,611 | 2/1984 | Oldham et al. ........................ 89/1.816 |
| 5,023,791 | 6/1991 | Hertzberg et al. ................. 364/424.04 |

FOREIGN PATENT DOCUMENTS 0167883  7/1986  Japan ................................ 324/158 F

*Primary Examiner*—Kenneth A. Wieder
*Assistant Examiner*—Barry C. Bowser
*Attorney, Agent, or Firm*—Shapiro and Shapiro

[57] ABSTRACT

A sequential connecting apparatus is used with an automatic testing apparatus to enable a plurality of electronic devices for testing to be automatically connected to the testing apparatus selectively in succession, thereby enabling unattended testing of the plurality of devices.

25 Claims, 6 Drawing Sheets

SEQUENTIAL CONNECTING APPARATUS FOR AUTOMATIC TESTING

This is a continuation of application Ser. No. 07/968,331 filed Oct. 29, 1992, now abandoned.

BACKGROUND OF THE INVENTION

1. Field of the Invention

The present invention relates to a sequential connecting apparatus which may be combined with an automatic testing apparatus for testing devices to be mounted on an aircraft and which enables unattended testing of a plurality of devices in succession.

2. Related Background Art

An automatic testing apparatus is used to test a device to be mounted on an aircraft such as an automatic variation computer. The automatic testing apparatus automatically tests the functions of the device.

The test by the automatic testing apparatus is conducted in the following sequence.

(1) An operator first connects an avionic device to be tested to a connector of the automatic testing apparatus. Usually, the number of devices which can be connected to the automatic testing apparatus at one time is one.

(2) The operator selects a test program for the equipment to be tested and inputs the selection into the automatic testing apparatus. Test contents for the equipment are programmed in the apparatus.

(3) The operator causes the automatic testing apparatus to execute the test program.

(4) When the automatic testing apparatus starts the execution of the test program, it requests to the operator, during the execution of the test program, to input data such as a type number of the device, a manufacture number, an operator name and a test date.

(5) The operator inputs those data into the automatic testing apparatus.

(6) The automatic testing apparatus then continues to execute the test program, and completes the function test of the equipment.

(7) When the function test of the equipment is completed, the operator takes the equipment out of the automatic testing apparatus. Where a plurality of devices are to be tested, the next device is mounted on the automatic testing apparatus and the above steps are repeated.

Since only one device may be mounted on the automatic testing apparatus at one time, where the functions of a plurality of devices are to be tested, the operator has to remove a device for which the test has been completed in order to mount the next device. This takes manpower. Further, since the automatic testing apparatus requests the input of the data such as the type number of the equipment, the manufacture number, the operator name and the test date during the execution of the test program, the operator has to stay at the automatic testing apparatus during the execution of the test program in order to input those data.

SUMMARY OF THE INVENTION

It is an object of the present invention to provide an apparatus which permits unattended function tests of a plurality of devices by an automatic testing apparatus.

In order to achieve the above object, in accordance with the present invention, a sequential connecting apparatus to be used with the automatic testing apparatus comprises a mounting device adapted for mounting a plurality of devices to be tested, and a connecting device for automatically connecting the plurality of devices to the automatic testing apparatus in succession. In a preferred embodiment, the connecting device has a connector for plugging and unplugging an automatic testing apparatus which tests the function of the devices, to and from the devices, and a system controller outputs to the connecting device a control signal for controlling the plugging/unplugging operation and generates to the automatic testing apparatus a data input signal in response to a request from the automatic testing apparatus.

In the foregoing apparatus of the present invention, the connecting device automatically plugs and unplugs the equipment to be tested to and from the automatic testing apparatus, and the system controller automatically sends the input data to the automatic testing apparatus in response to the request by the automatic testing apparatus. These operations are more fully described hereinafter.

DETAILED DESCRIPTION OF THE PREFERRED EMBODIMENTS

The present invention is now explained in detail with reference to the illustrated embodiment.

Figure 1:
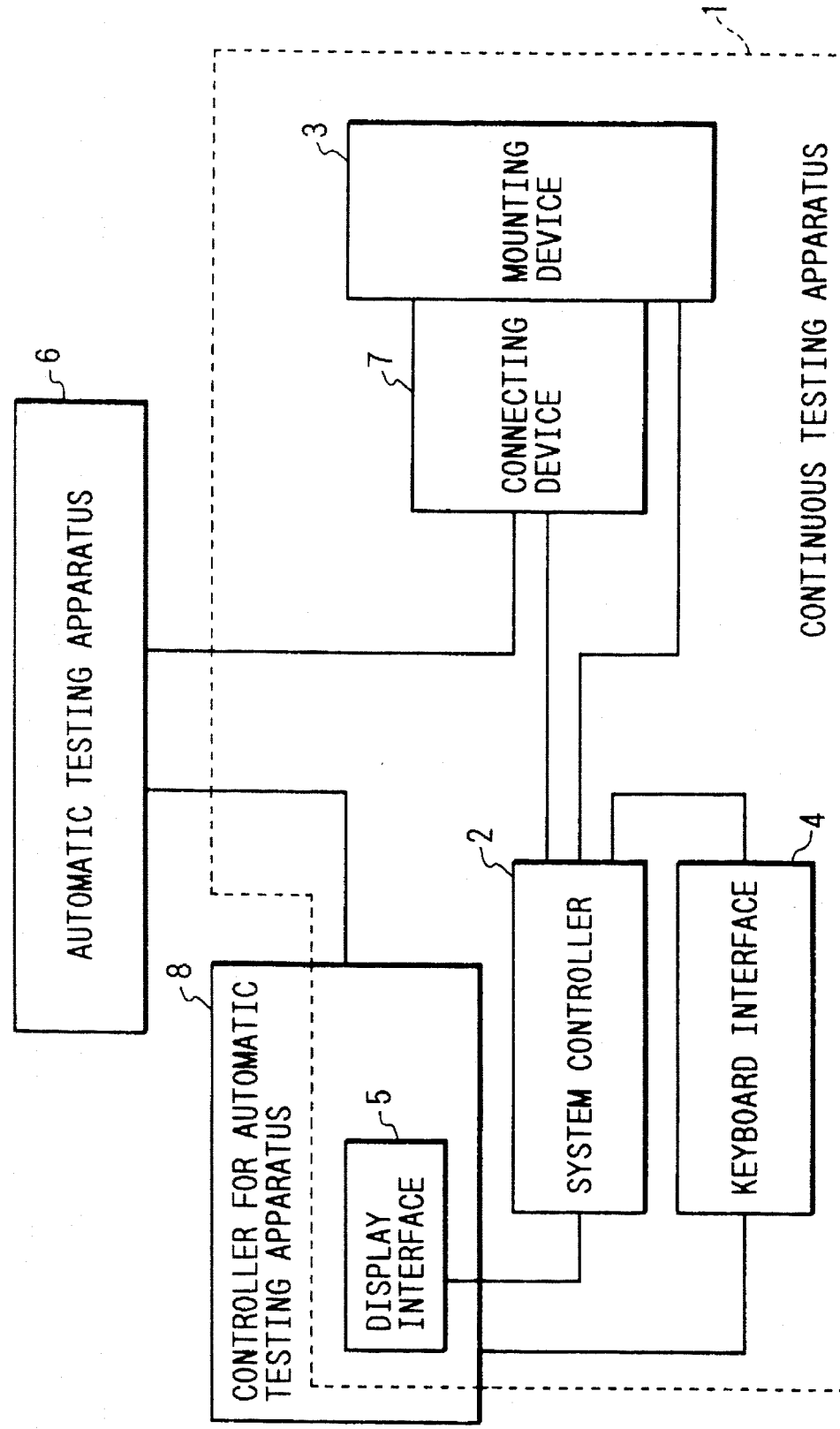
FIG. 1 shows a diagram of a system incorporating a sequential connecting apparatus of the present invention.
Figure 2:
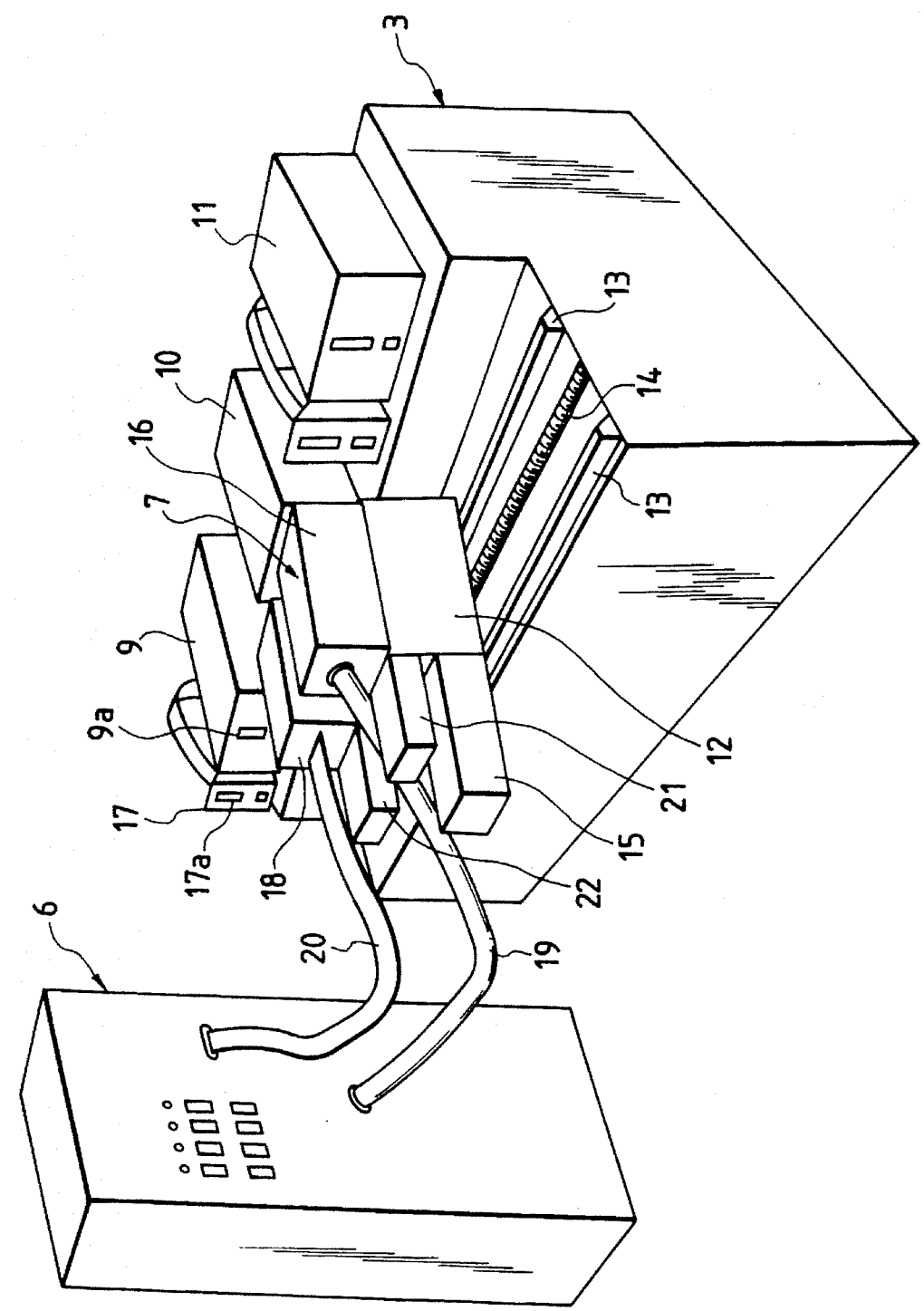
FIG. 2 shows a perspective view of a mount device and a connecting device of the apparatus of the present invention.

FIG. 1 shows a configuration of a system incorporating a sequential connecting apparatus 1 of the present invention.

The apparatus 1 comprises a system controller 2, a mount device 3, a keyboard interface 4 and a display interface 5.

The system controller 2 controls a connecting device 7 to automatically plug and unplug an equipment (to be tested) mounted on the mount device 3, to and from an automatic testing apparatus 6. When the automatic testing apparatus 6 executes a test program, the system controller 2 sends an input data signal to a controller 8 of the automatic testing apparatus to execute the test program.

The connecting device 7 automatically plugs and unplugs the equipment to and from the automatic testing apparatus 6 by a command from the system controller 2. In plugging unplugging a connector of the connecting device 7 to and from the equipment, safety is monitored by a sensor, and if an abnormal condition is detected, a warning signal is sent from the connecting device 7 to the system controller 2, which, in response to the warning signal, sends a stop signal to 7 to deactivate the connecting device 7, to the connecting device 7.

In the test of a device by the automatic testing apparatus 6, it is necessary to send input data such as the type number of the device and the manufacture number from the system controller 2 to the controller 8 of the automatic testing apparatus in the course of the test. The keyboard interface 4 functions to convert the input data signal from the system controller 2 to an actual keyboard signal for the controller 8 of the automatic testing apparatus.

The display interface 5 is contained in the controller 8 of the automatic testing apparatus. In the test of equipment by the automatic testing apparatus 6, a message to the operator is displayed on a screen of the controller 8 of the automatic testing apparatus, and the test program stops to monitor a key entry from the operator. In order to automatically resume the test, it is necessary for the system controller 2 to decode the message. The display interface functions to convert the message from the controller 8 of the automatic testing apparatus to a signal which the system controller 2 can decode.

An operation of the apparatus of the present invention is now described.

The operator mounts devices 9, 10 and 11 to be tested at left, center and right positions of the mount device 3, respectively, and secures them by fixing members such as bolts. In the present embodiment, three devices are mounted, but this number is merely illustrative.

Next, the system controller 2, the mount device 3 and the keyboard interface 4 are powered on in this sequence. About 20 minutes after the power-on of the mount device 3, an INIT switch lamp on a console panel is lit. When the lamp is lit, an INIT switch is depressed to return a connector table 12 of the connecting device 7 on the mount device 3 to a home position so that a reference position is set. The operator confirms the turn-off of the INIT switch lamp after the return to the home position.

The connector table 12 is driven by a drive shaft 14 (a screw-type shaft as shown) along a rail 13 on the mount device 3.

Figure 3:
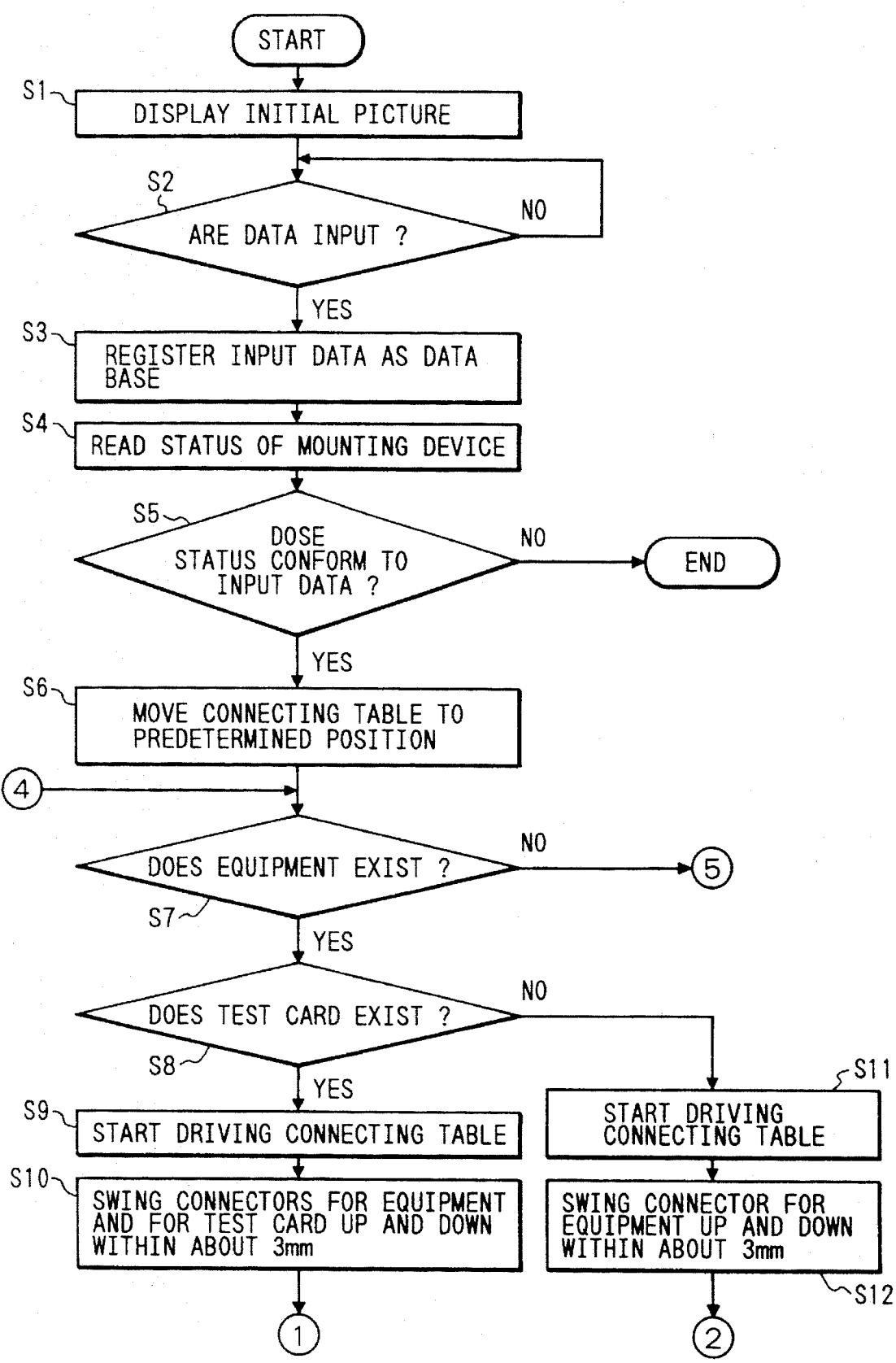
FIGS. 3 to 5 show flow charts of operations of a system controller.
Figure 4:
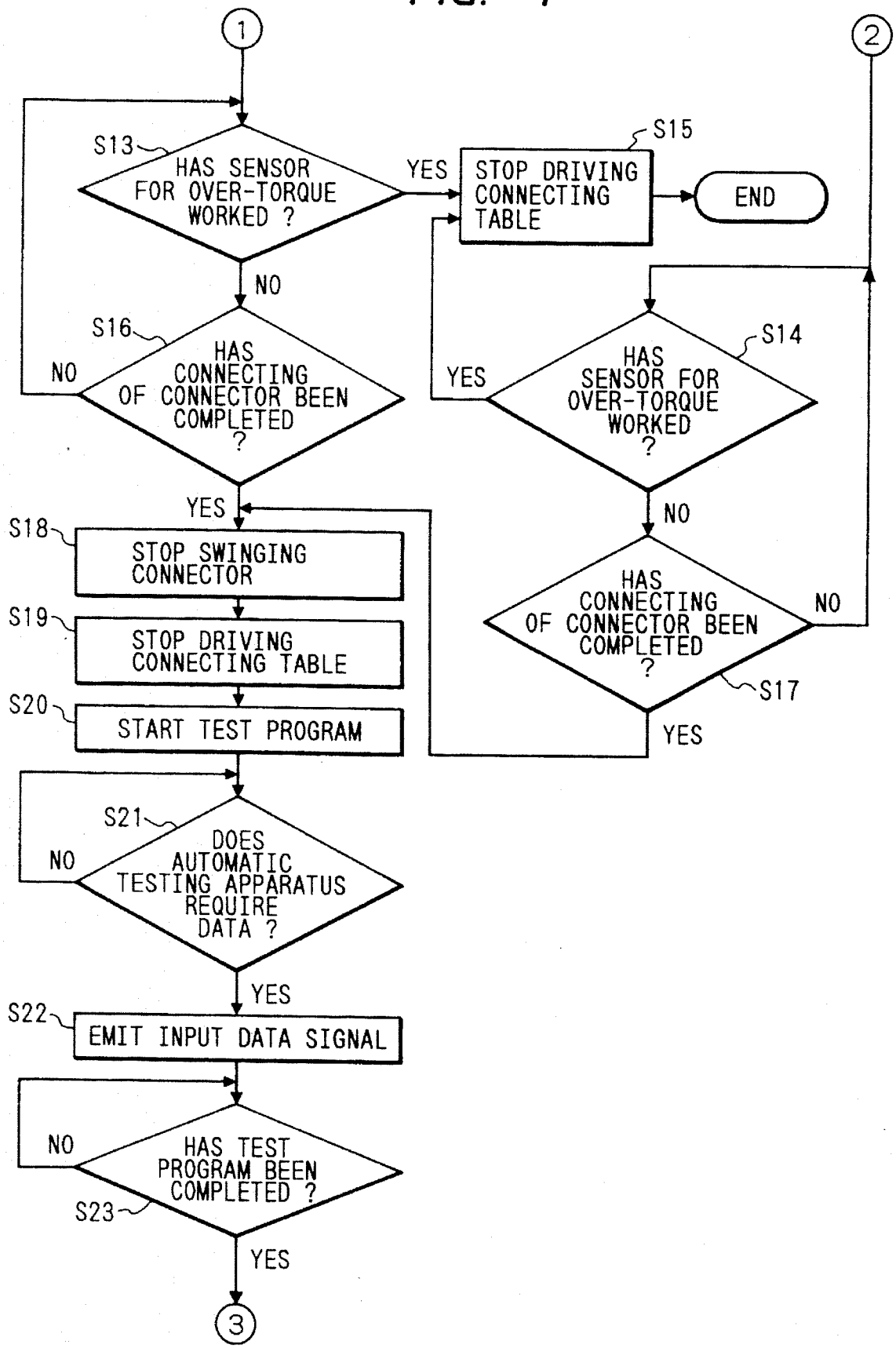
Figure 5:
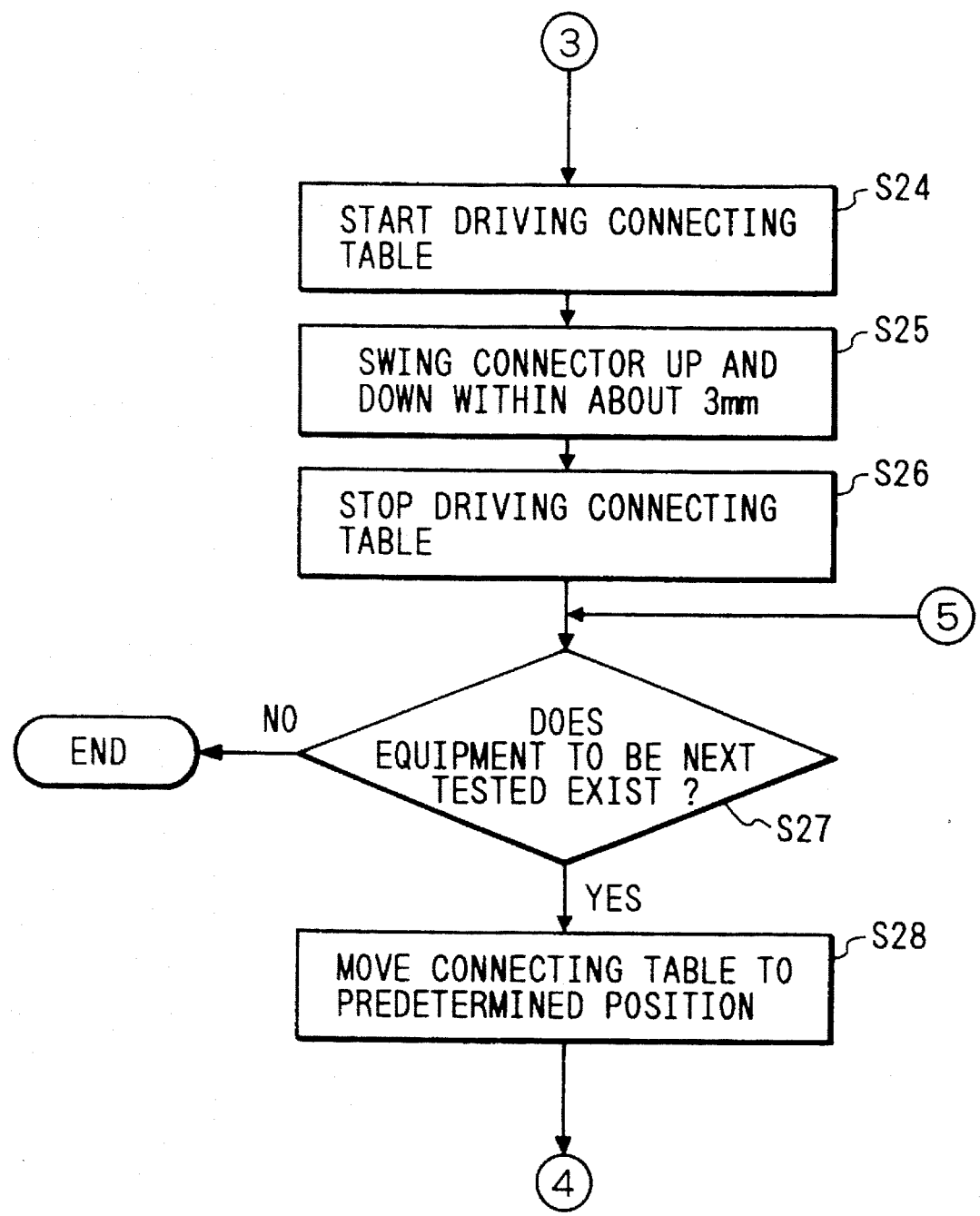

When the system controller 2 is powered on, the program of the continuous testing apparatus 1 is automatically started. An operation of the system controller 2 is explained with reference to FIGS. 3 to 5. The system controller 2 is started at the power-on and displays an initial image in a step S1. The operator inputs the positions of the devices to be tested, pertinent data (type numbers, the manufacture numbers, the operator name, etc.) and the test program in accordance with the command on the display. In a step S2, the system controller 2 confirms that all data have been inputted, and registers the input data to the system controller 2 as a database (step S3). The database may be designed such that the type number may be omitted if the manufacture number is entered. In the repetitive test, the items, the number of times and the time for the repetitive test are entered. In the repetitive test, a portion of the test items of the test program, for example, second to 98th items of 100 items are repeatedly tested. When the automatic testing apparatus 6 needs the input from the operator in the course of the test, the system controller 2 sends the data to the controller 8 of the automatic testing apparatus through the keyboard interface 4.

When the entry of all data is completed, whether the devices 9, 10 and 11 are mounted at the respective positions of the mount device 3 or not is checked by the sensor. The status of the mount device 3 at this time is read by the system controller 2 (step S4). In a step S5, whether the status of the mount device 3 matches to the input data or not is checked, and if it matches, the automatic test of the devices is started.

When the automatic test is started, the system controller 2 drives the connector table 12 on the mount device 3 to the left position at which the equipment (device) 9 is mounted (step S6). The system controller 2 checks the presence or absence of the equipment (step S7). If there is no equipment, the process proceeds to a step S27 to test the next equipment. If the presence of the equipment is detected, the system controller 2 checks the presence or absence of a test card for the equipment (step S8). If there are equipment and equipment test card, the connector table 12 starts to move toward the equipment 9 by a motor 15 (step S9). A connector 16 on the connector table 12 is connected to a connector 9a of the equipment 9 by a motor 21 while it is swung vertically by approximately 3 mm, and a connector 18 on the connector table 12 is connected to a connector 17a of the test card 17 for the equipment 9 while it is swung vertically by approximately 3 mm (step S10). If there is no equipment test card in the step S8, the drive of the connector table 12 is started in a step S11, and the connector 16 is connected to the equipment 9 while it is swung vertically by approximately 3 mm (step S12).

Since there are about 600 pins in the connector 16, a large load is imparted in the connection. When an excess load is imparted when the connector 16 is connected to the equipment 9, the connecting device may be broken. In order to prevent this, an excess load is sensed by an overtorque sensor (steps S13 and S14). When the overtorque sensor senses the excess load, the drive of the connector table 12 is stopped (step S15).

The connectors 16 and 18 are connected to the automatic testing apparatus 6 by wires 19 and 20. When the connection of the connectors is completed (steps S16 and S17), the swing of the connectors and the drive of the connector table are stopped (steps S18 and S19), and the automatic testing apparatus 6 executes the test program (step S20). In a step S21, the system controller 2 checks if the automatic testing apparatus 6 has requested data during the execution of the test program or not. The message signal from the automatic testing apparatus 6 is converted to a signal which can be decoded by the system controller 2 by the display interface 5 of the controller 8 of the automatic testing apparatus, and it is sent to the system controller 2. The system controller 2 generates the data requested by the automatic testing apparatus 6 (such as the type number, the manufacture number and the operator name) as the input data signal (step S22). The input data signal is converted by the keyboard interface 4 to a signal which can be decoded by the controller 8 of the automatic testing apparatus, and it is sent the controller 8 of the automatic testing apparatus. The automatic testing apparatus 6 resumes the execution of the test program in accordance with the input data.

In a step S23, the system controller 2 checks if the test program of the automatic testing apparatus 6 has been completed or not. If the test program has been completed, the connector table 12 is driven off the equipment 9 by the motor 15 to unplug the connector (step S24). Since a large force is required to unplug the connector straight out, the connector 16 is vertically swung by the motor 21 by approximately 3 mm (step S25). If there is an equipment test card, the test card connector 18 is also unplugged while it is vertically swung by the motor 22 by approximately 3 mm. In order to swing the connector, an elliptical cam is driven by the motor. When the connector is unplugged, the drive of the connector table 12 is stopped (step S26).

When the test of the equipment 9 is over and the connector is unplugged, the system controller 2 checks if there is an equipment (a device) to be tested next (step S27). If there is no equipment to be tested, the program is terminated, and if there is an equipment to be tested, the connector table 12 is driven to the position of the next equipment (step S28). In the present embodiment, the connector table 12 is driven to the center position at which the next equipment 10 is mounted, and the steps S7 to S27 are repeated.

Figure 6:
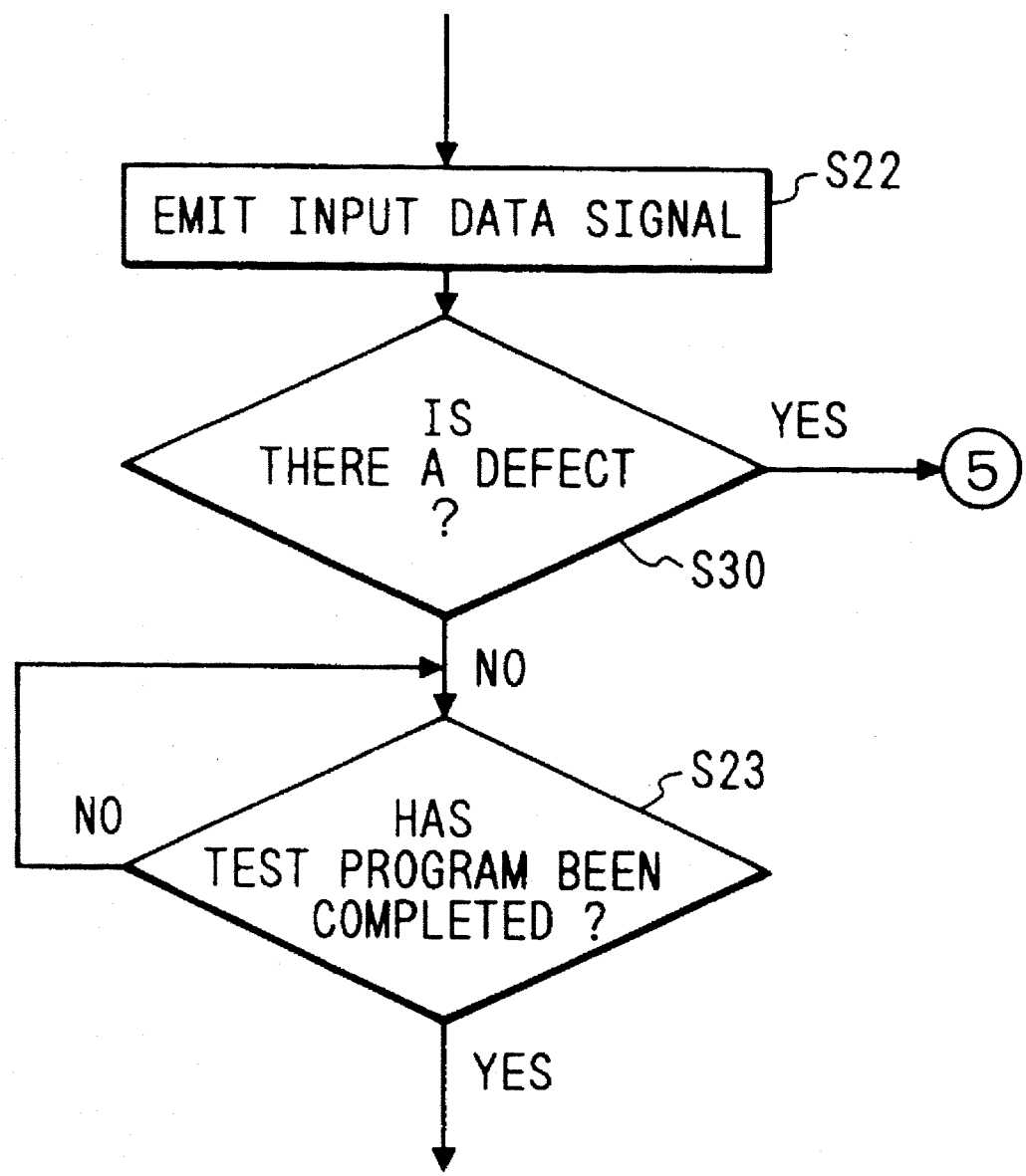
FIG. 6 shows a flow chart of an operation of another system controller.

If an error occurs in the course of the test, the process may jump to the test of the next equipment. For example, as shown in FIG. 6, a step S30 may be provided between the steps S22 and S23, and if the system controller 2 detects an error in the equipment in the course of the execution of the test program, the process returns to the step S27 to test the next equipment.

The order of test of the different pieces of equipment may be predetermined.

After the test, an operator message may be printed out to confirm the test contents.

In the present embodiment, devices of the same type are successively tested, although devices of different types may also be tested in accordance with the invention.

Since it is necessary to change the connectors for different types of equipment, different connectors may be provided in the connecting device 7. For example, the connection device 7 may be of two-stage structure to accommodate two types of connectors so that two types of equipments can be successively tested.

In the system of the present invention, the connecting device automatically plugs and unplugs the equipment to be tested to and from the automatic testing apparatus, and the system controller automatically sends the input data to the automatic testing apparatus in response to the request from the automatic testing apparatus. Therefore, the unattendanted testing of a plurality of devices can be effected and the operability is improved.

What is claimed is:

1. A sequential connecting apparatus for testing avionics devices, comprising:

a mounting device on which a plurality of avionics devices are to be mounted in a line;

a connecting device having a connector for electrically connecting and disconnecting each of said avionics devices to and from an automatic testing apparatus for testing functions of said devices, said connecting device being drivingly mounted to said mounting device to be driven on said mounting device along the line of avionics devices; and a system controller for causing said connecting device automatically to be driven along the line of avionics devices and to electrically connect and disconnect each of said avionics devices to and from the automatic testing apparatus selectively, in succession, and for generating a data input signal for said automatic testing apparatus in response to a request from said automatic testing apparatus.

2. A sequential connecting apparatus for testing avionics devices, comprising:

a mounting device on which a plurality of avionics devices are to be mounted in a line;

a connecting device having a connector for electrically connecting and disconnecting each of said avionics devices to and from an automatic testing apparatus for testing functions of said devices, said connecting device being drivingly mounted to said mounting device to be driven along the line of avionics devices;

a system controller for causing said connecting device automatically to be driven along the line of avionics devices and to electrically connect and disconnect each of said avionics devices to and from said automatic testing apparatus selectively, in succession, and for generating a data input signal for said automatic testing apparatus in response to a request from said automatic testing apparatus;

a display interface for converting a message signal from said automatic testing apparatus to a signal decodable by said system controller; and a keyboard interface for converting the data input signal from said system controller to a signal decodable by said automatic testing apparatus.

3. A sequential connecting apparatus according to claim 1, wherein said system controller includes a memory for storing data regarding said avionics devices.

4. A sequential connecting apparatus according to claim 1, wherein said system controller includes means for checking whether a said avionics device is mounted at a predetermined position of said mounting device.

5. A sequential connecting apparatus according to claim 1, wherein said connecting device includes a test card connector for electrically connecting and disconnecting an equipment test card to and from said automatic testing apparatus.

6. A sequential connecting apparatus according to claim 5, wherein said system controller includes means for checking the presence or absence of the equipment test card.

7. A sequential connecting apparatus according to claim 1, wherein said connecting device includes positioning means for determining a positional relationship between the connector and a selected one of said avionics devices.

8. A sequential connecting apparatus according to claim 1, wherein said connecting device includes an overtorque sensor for generating a warning signal when an excess load is imparted in connecting or disconnecting a selected one of said avionics devices, and said system controller responds to the warning signal to send a signal to stop the connecting or disconnecting of said one device.

9. A sequential connecting apparatus according to claim 1, wherein said connecting device swings said connector transversely to a connecting/disconnecting movement direction of said connector when said connector is to be connected to or disconnected from a selected one of said avionics devices.

10. A sequential connecting apparatus according to claim 1, wherein said connecting device includes different types of connectors to permit the connection and disconnection of different types of avionics devices to and from said automatic testing apparatus.

11. A sequential connecting apparatus for testing avionics devices, comprising:

a mounting device adapted to receive a plurality of avionics devices to be tested by an automatic testing apparatus; and a connecting device electrically connectable to each of said avionics devices, selectively, to connect said avionics devices to the automatic testing apparatus, said connecting device being automatically drivable on said mounting device, from one of said avionics devices to another, to connect said avionics devices to the automatic testing apparatus automatically, in succession.

12. A sequential connecting apparatus according to claim 11, further comprising a controller for controlling the automatic connection of said connecting device to said avionics devices and outputting a data signal corresponding to the connected avionics device.

13. A sequential connecting apparatus according to claim 11, wherein said connecting device includes connectors for connecting to different types of avionics devices.

14. A sequential connecting apparatus according to claim 11, wherein said connecting device includes a plug-in type connector for connecting to said avionics devices.

15. A sequential connecting apparatus according to claim 14, wherein said connecting device swings said connector transversely to a plug-in movement direction when said connector is plugged or unplugged to or from one of said avionics devices.

16. A system for testing avionics devices, comprising:
an automatic testing apparatus for testing functions of an avionics device; and
a sequential connecting apparatus, including a mounting device adapted to receive a plurality of avionics devices to be tested by said automatic testing apparatus, and a connecting device electrically connectable to each of said avionics devices, selectively, to connect said avionics devices to said automatic testing apparatus, said connecting device being automatically drivable on said mounting device, from one of said avionics devices to another, to connect said avionics devices to said automatic testing apparatus automatically, in succession.

17. A system according to claim 16, wherein said sequential connecting apparatus further comprises a controller for controlling the connection of said connecting device to said avionics devices and generating a data input signal for said automatic testing apparatus in response to a request from said automatic testing apparatus.

18. A system according to claim 17, wherein said sequential connecting apparatus includes a display interface for converting a message signal from said automatic testing apparatus to a signal decodable by said controller, and a keyboard interface for converting said data input signal from said controller to a signal decodable by said automatic testing apparatus.

19. A system according to claim 16, wherein said sequential connecting apparatus includes means for driving said connecting device automatically between connecting positions corresponding to each of said avionics devices.

20. A system according to claim 16, wherein said connecting device includes different types of connectors for connecting to different types of avionics devices.

21. A system according to claim 16, wherein said connecting device includes a plug-in type connector for connecting to said avionics devices.

22. A sequential connecting apparatus according to claim 1, including a screw-type drive which drives said connecting device on said mounting device.

23. A sequential connecting apparatus according to claim 2, including a screw-type drive which drives said connecting device on said mounting device.

24. A sequential connecting apparatus according to claim 11, including a screw-type drive which drives said connecting device on said mounting device.

25. A system according to claim 16, including a screw-type drive which drives said connecting device on said mounting device.

* * * * *